United States Patent [19]

Murakami et al.

[11] Patent Number: 5,442,418
[45] Date of Patent: Aug. 15, 1995

[54] EXPOSURE METHOD

[75] Inventors: Masaichi Murakami; Muneyasu Yokota; Toshio Matsuura, all of Tokyo; Atsuyuki Aoki, Yokohama, all of Japan

[73] Assignee: Nikon Corporation, Tokyo, Japan

[21] Appl. No.: 318,521

[22] Filed: Oct. 5, 1994

Related U.S. Application Data

[63] Continuation of Ser. No. 70,178, Jun. 2, 1993, abandoned.

[30] Foreign Application Priority Data

Jun. 9, 1992 [JP] Japan .................................. 4-149278

[51] Int. Cl.$^6$ .............................................. G03B 27/42
[52] U.S. Cl. ...................................... 355/53; 355/52
[58] Field of Search .................................. 355/52, 53

[56] References Cited

U.S. PATENT DOCUMENTS

| 4,734,746 | 3/1988 | Ushida et al. .................... 355/53 |
| 4,980,718 | 12/1990 | Salter et al. ..................... 355/53 |
| 5,008,702 | 4/1991 | Tanaka et al. ................... 355/53 |

FOREIGN PATENT DOCUMENTS 63-211623  9/1988  Japan .

*Primary Examiner*—Monroe H. Hayes
*Attorney, Agent, or Firm*—Shapiro and Shapiro

[57] ABSTRACT

Prior to exposures, the imaging characteristics of a projection optical system to be used are determined by measuring the positions of plural projection points (evaluation points) within the projection area, on a photosensitive substrate, of the projection optical system. Then the positional aberrations between the evaluation points are determined in the area of image superposition or jointing, and correcting parameters are determined so as to minimize at least the component of the aberrations in a direction, perpendicular to an extending direction patterns of a reticle. The reticle or the photosensitive substrate is rotated or shifted according to thus determined correcting parameters. This exposure method achieves the superposition or jointing of patterns, or the superposition of the jointed parts thereof, in optimum manner, according to the structure (directionality) of the patterns or the imaging characteristics of the projection optical system employed.

13 Claims, 6 Drawing Sheets

EXPOSURE METHOD

This is a continuation of application Ser. No. 08/070,178 filed Jun. 2, 1993, now abandoned.

BACKGROUND OF THE INVENTION

1. Field of the Invention

The present invention relates to an exposure method for producing a liquid crystal display device or a semiconductor device, and more particularly an exposure method for forming patterns of plural layers in superposed manner on a substrate, or exposing a large-sized substrate to small pattern area in mutually connected manner for obtaining a large-sized device.

2. Related Background Art

For forming a large-sized liquid crystal display device or the like on a substrate, there has been employed a method of providing small pattern area in continuation on the substrate, by means of a step-and-repeat projection exposure apparatus. However, because of the imaging characteristics of the projection optical system, such as distortion aberration, the continuous (junction) portion of the adjacent small pattern areas may be aberrated from the proper junction state in which the pattern is formed in continuous state. In case of such "aberration" or low precision of junction, the performance of device in such area becomes deteriorated in comparison with that of other areas, and there may eventually result a difference in image contrast or in color, detectable by the human eyes.

Also in the formation of a device there is often conducted the exposure of a pattern in superposition on an already exposed pattern. The above-mentioned deterioration of the performance of the device will also occur in such case if the precision of such pattern superposition is not adequate.

In order to improve the precision of junction or superposition of the pattern areas, there has been employed a method of detecting the aberration of a representative position (representative point) in the actually exposed pattern and determining the correcting parameters so as to minimize said aberration. More specifically, in the junction or superposition of the pattern areas, there is employed a reticle provided with a vernier pattern in the vicinity of the pattern area, whereby said vernier pattern is exposed also in superposition, and the correcting parameters (amount of two-dimensional shifts and rotation of the photosensitive substrate) are determined so as to minimize the reading of said vernier pattern, for example by the minimum square method.

However, such conventional technology, being based on the imaging characteristics of limited representative points in the projection area of the projection optical system, is incapable of sufficient correction on the image which is different in position from such representative points. Also in case of superposing patterns to be exposed utilizing mutually different partial areas within the projection area, there is required a precise correction for such partial areas, but, in the conventional technology, the correction for such partial areas is unsatisfactory because the correction is made only on said representative points in the projection area. A same situation occurs also when the patterns are superposed with different plural projection optical systems.

Furthermore, in case of exposing plural patterns in mutual junction, said patterns cannot be connected with a sufficient precision, since the partial areas, corresponding to the junction portion, within the projection area are different in the state of correction.

Furthermore, the patterns constituting the device have an extending direction (X, Y directions), and, in certain device structures, the performance of the device depends on this direction. For this reason it is sometimes required, not only to improve the precision of junction or superposition, or the precision of superposition of the junction portion, in the X- and Y-directions, but also to achieve a particularly high precision in a specified direction. Also in such case, the conventional technology, designed to determine the correcting parameters only by the representative points predetermined in consideration of the directions requiring precision and those not requiring precision, is incapable of sufficient correction for such direction requiring a particularly high precision.

SUMMARY OF THE INVENTION

In consideration of an foregoing, the object of the present invention is to provide an exposure method capable of superposition or junction, or superposition of a junction portion, according to the structure (directionality) of the device or the imaging characteristics of the projection optical system to be employed.

The above-mentioned object can be attained, according to the present invention, in exposing a photosensitive substrate to a first image of a pattern on a first original reticle through a projection optical system and then exposing said substrate to a second image of a pattern on a second original reticle in superposition with said first image through the projection optical system, by determining, prior to said exposures, the two directional positions of the images to be exposed on the photosensitive substrate by the projection optical system; then determining the deviation between the positions corresponding to the junction portions of the images to be exposed in superposition, within said two-dimensional positions; and causing a relative movement between the original reticle and the photosensitive substrate or varying the imaging characteristics of the projection optical system so as to minimize said deviation or a component thereof in a direction determining by to the directionality of the patterns.

Said object can also be attained, in exposing a photosensitive substrate to a first image of a pattern on a first original reticle through a projection optical system and then exposing said substrate to a second image of a pattern on a second original reticle in junction to said first image through the projection optical system, by determining, prior to said exposures, the two-dimensional positions of the images to be exposed on the photosensitive substrate by the projection optical system; then determining the deviation between the positions corresponding to the junction portions of the images to be exposed in junction relationship, within said two-dimensional positions; and causing a relative movement between the original reticle and the photosensitive substrate or varying the imaging characteristics of the projection optical system so as to minimize said deviation or a component thereof in a direction determined by to the directionality of the pattern.

Said object can also be attained, in exposing a photosensitive substrate to a first image of a pattern on a first original reticle through a projection optical system and then exposing said substrate to a second image of a pattern on a second original reticle in superposition to said first image through the projection optical system, by determining the two-dimensional positional aberration of the first and second images exposed on the photosensitive substrate in superposition by the projection optical system; and causing a relative movement between the original reticle and the photosensitive substrate or varying the imaging characteristics of the projection optical system so as that the positional aberration becomes a predetermined value, according to the directionality of the patterns.

Said object can also be attained in exposing a photosensitive substrate to a first image of a pattern on a first original reticle through a projection optical system and then exposing said substrate to a second image of a pattern on a second original reticle in junction to said first image through the projection optical system, by determining the two-dimensional positional aberration of the first and second images exposed on the photosensitive substrate in junction relationship by the projection optical system; and causing a relative movement between the original reticle and the photosensitive substrate or varying the imaging characteristics of the projection optical system so as that the positional aberration becomes a predetermined value, according to the directionality of the patterns.

Said object can furthermore be attained, in exposing a photosensitive substrate to a plurality of a first image of a pattern on a first original reticle through a projection optical system and then exposing said substrate to a plurality of a second image of a pattern on a second original reticle in respective superposition to said first images with mutual junction of said second images, by determining, prior to said exposures, the two-dimensional positions of the images to be exposed on the photosensitive substrate by the projection optical system; determining a first two-dimensional position in the vicinity of the junction portion of the first images to be exposed in junction and a second two-dimensional position of the second image to be exposed in superposition to the first image within the above-mentioned two-dimensional positions; and causing a relative movement between the original reticle and the photosensitive substrate or varying the imaging characteristics of the projection optical system so as to minimize a component, in a direction determined by to the directionality of the pattern, of the deviation between the first and second positions (said deviation being the different between the precisions of junction and superposition, and representing the precision of superposition in the junction portion).

The present invention can achieve more precise, necessary and sufficient connection, since the correcting parameters for superposition and junction of the patterns are determined in consideration of the directionality of the device and the imaging characteristics in a portion to be used in the pattern exposure, within the projection area of the projection optical system.

More specifically, exposures with more precise superposition or junction are rendered possible, because the correcting parameters are determined in consideration of the imaging characteristics relative to the area to be used for actual exposures within the projection optical system, and of those characteristics relative to the area of superposition or junction, and also because the positional aberration in a direction requiring precision is corrected in consideration of the directionality of the patterns to be exposed.

DESCRIPTION OF THE PREFERRED EMBODIMENTS

Figure 1:
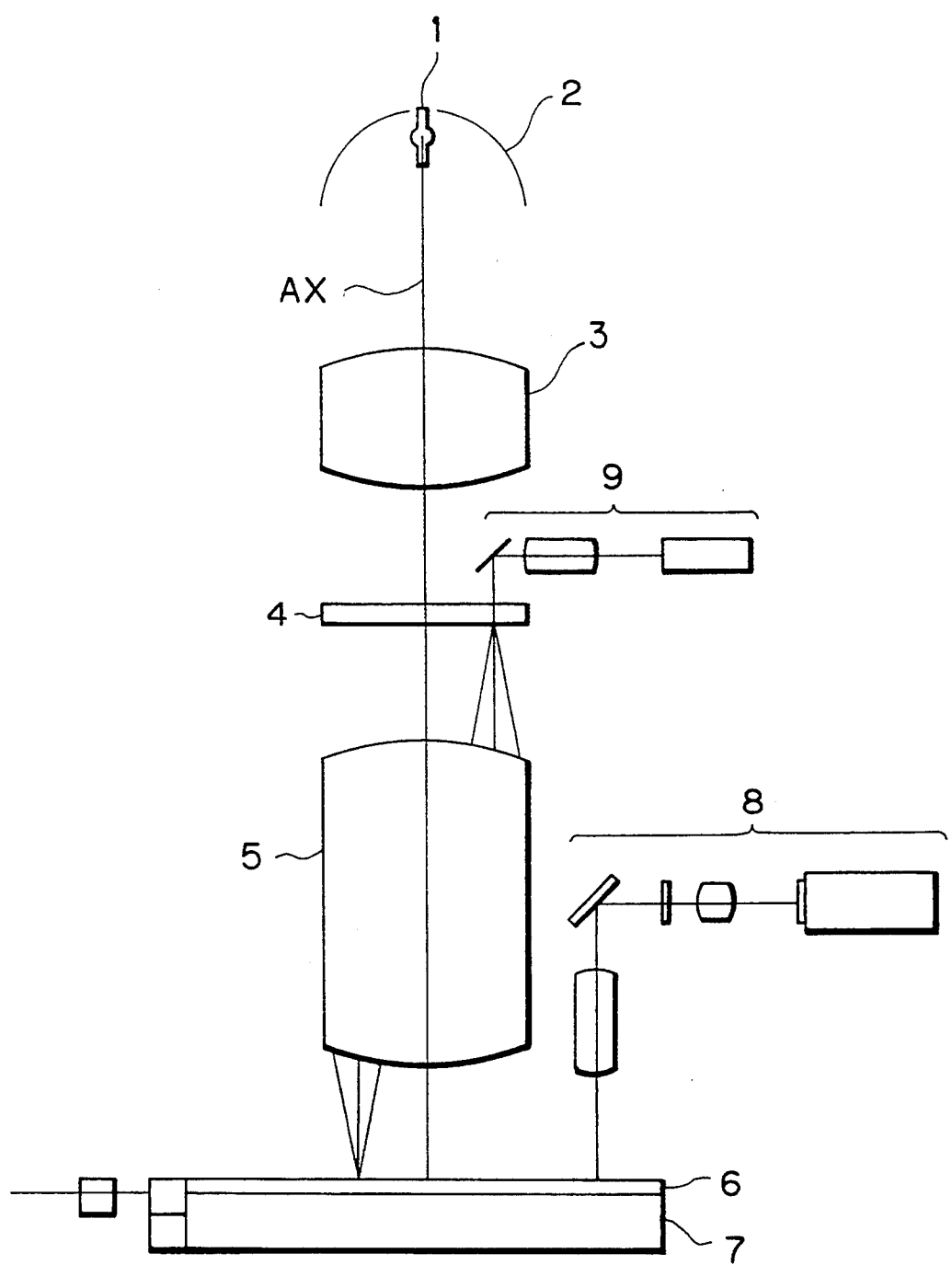
FIG. 1 is a schematic view of an exposure apparatus adapted for use in the exposure method embodying the present invention.

FIG. 1 is a schematic view of a projection exposure apparatus adapted to be applied to the exposure method embodying the present invention. Light emitted by a light source 1 is reflected by an elliptical mirror 2 and enters an illuminating optical system 3. The light beam of uniform illumination intensity obtained from said system 3 uniformly illuminates a reticle 4. An image of the pattern of the reticle 4 is projected, through a projection optical system 5, onto a photosensitive substrate 6 placed on a stage 7 which is rendered movable two-dimensionally and in the direction of optical axis AX. An off-axis alignment optical system 8 can be based on various principles, such as a system of irradiating an alignment mark on the photosensitive substrate 6 with a laser beam and detecting the diffracted light, or a system of detecting and processing the image of the alignment mark. A TTL alignment optical system 9 is provided for aligning an alignment mark on the reticle 4 with an alignment mark on the photosensitive substrate 6.

In producing a liquid crystal display device or a large-sized semiconductor device, the above-explained exposure apparatus is used for exposing the photosensitive substrate to the patterns of reticles, in jointed or superposed manner. Such jointed or superposed exposure method will be explained in the following.

Figure 2:
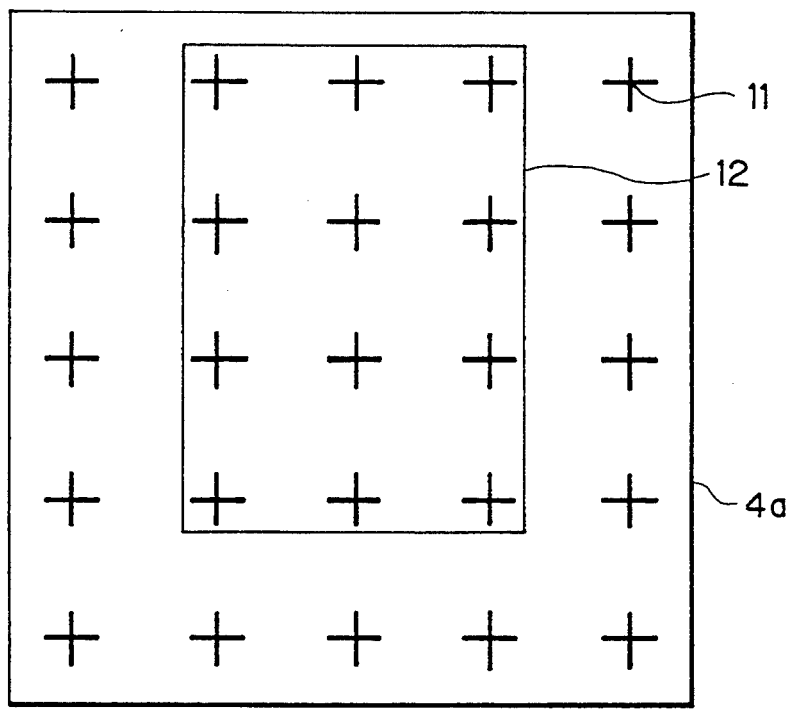
FIG. 2 is a view of a reference reticle to be employed in the exposure method embodying the present invention.

In the following there will be explained, with reference to FIGS. 2 to 5, an exposure method constituting a first embodiment of the present invention, in which patterns are exposed in superposed manner, utilizing two projection optical systems. FIG. 2 shows a reference reticle which is to be employed in the present invention, and which is provided with plural evaluation marks 11 for evaluating the imaging characteristics such as distortion, within a pattern area. Said evaluation marks 11 are formed, for example, as cross-shaped marks, in order to enable measurement of two-dimensional positions thereof of the projected image.

Figure 3:
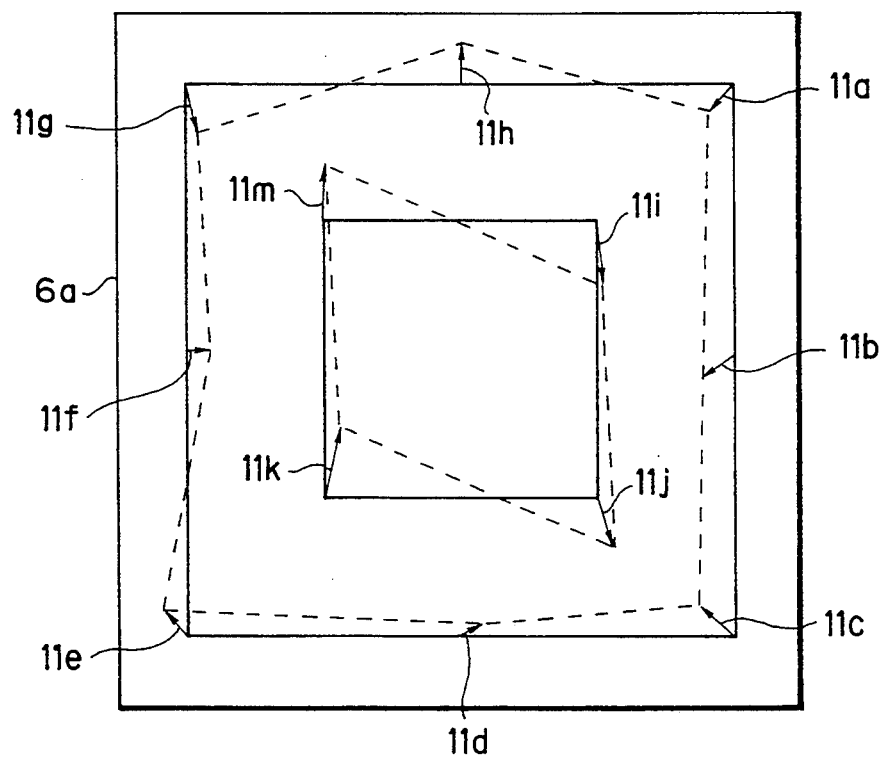
FIGS. 3 and 4 are views of evaluation points on a photosensitive substrate, obtained by projecting the reference reticle of FIG. 2 through a projection optical system.
Figure 4:
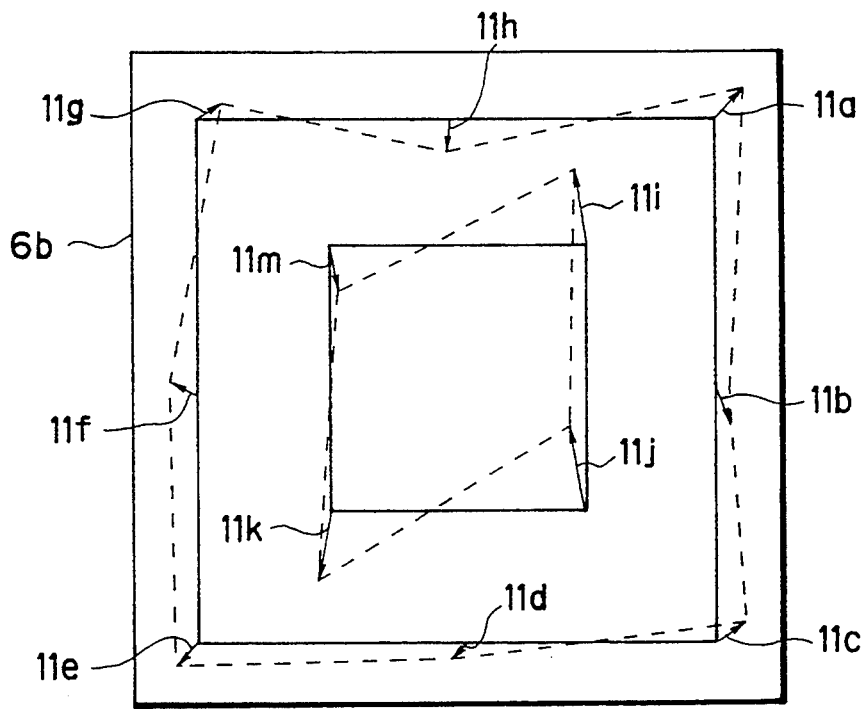
Figure 5:
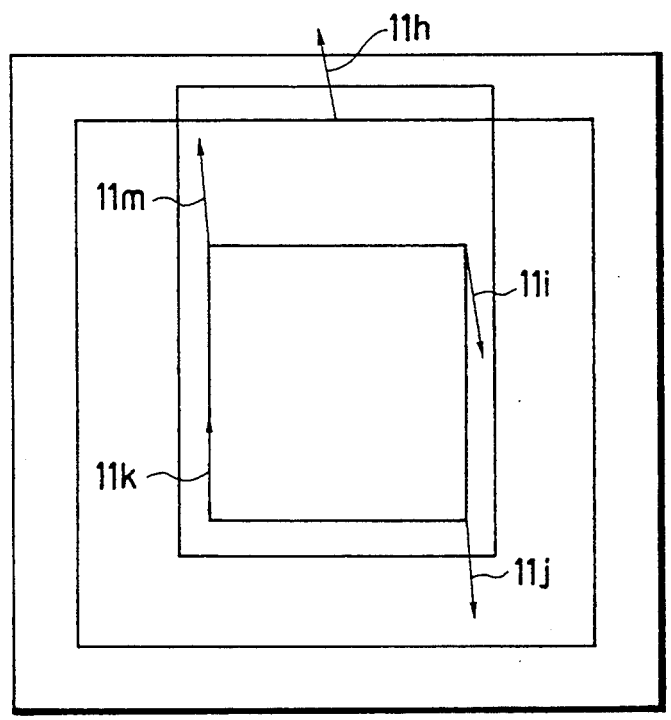
FIG. 5 is a view showing aberrations in the evaluation points on the photosensitive substrate obtained when the areas shown in FIGS. 3 and 4 are exposed in superposed manner.

FIGS. 3 and 4 show imaging characteristics of two different projection optical systems. The images of the evaluations marks 11 of the reticle 4a are projected in projection areas 6a, 6b of the projection optical systems on the photosensitive substrate, and said images are regarded as evaluation points. FIGS. 3 and 4 only show representative ones of the plural evaluation points. Ideally, said evaluation points are projected on points 11a–11m, which constitute rectangular patterns as indicated by solid lines. In practice, however, because of the influence of the imaging characteristics of the projection optical system, the positions of the evaluation points are aberrated and deformed as indicated by broken lines. Arrows from the evaluation points indicate the directions and amounts of aberrations from the ideal positions of the evaluation points.

Now let us consider a case of superposed exposures of only the pattern of a partial area 12 of the reference reticle shown in FIG. 2, within the pattern areas of two reticles, through the above-mentioned two projection optical systems. In a state without any correction, the aberrations of the superposedly exposed evaluations points are as indicated by arrows in FIG. 5. Thus, prior to the actual superposed exposures, the above-mentioned reticle projected onto the photosensitive substrate, and the data on the imaging characteristics of the projection optical systems are obtained by determining positions of the exposed evaluation points. Among the obtained data of the imaging characteristics, those corresponding to the area 12 are selected in each projection optical system, and there is determined the deviation (positional aberration) of the positions to be mutually superposed (for example the position 11h of the projection area 6a and that 11h of the projection area 6b; the position 11i of the projection area 6a and the position 11i of the projection area 6b etc.), and a correction parameter is selected so as to minimize the maximum among such deviations. Said correction parameter can be at least one of the rotation of the reticle, the two-dimensional shift thereof, the rotation of the photosensitive substrate, the two-dimensional shift thereof, the amount of elongation or contraction thereof, and the projection magnification of the projection optical system. Said correcting parameter can also be determined so as to minimize the determined deviations, by means of the minimum square method. The actual superposed exposures are conducted with a relative movement of the reticle and the photosensitive substrate, or with a variation in the projection magnification of the projection optical systems, according to said correcting parameter.

However, the pattern to be actually exposed has a directionality according to the device structure. For example, in case of superposed exposures of a pattern extending in the X-direction, the position in the Y-direction is required to have a higher precison than in the position in the X-direction. In such case, the correcting parameters are preferably so determined as to effect sufficient correction in the direction requiring a higher precision. Therefore, the above-mentioned deviations are determined in the X- and Y-components thereof, and the correcting parameters are so determined as to minimize the components in a direction determined by to the directionality of the pattern.

The foregoing embodiment has described a case of pattern superposing with different projection optical systems, but the above-explained principle is also applicable in case of pattern superposition with a same projection optical system. This is particularly useful in case of superposed exposure of plural patterns, provided in different areas of reticle. In such case, the plural patterns are projected onto the substrate through different projection areas of a projection optical system. Consequently, the projected images of said patterns are influenced by different imaging characteristics. The same concept, therefore, is applicable as in the aforementioned case of superposed exposures with two projection optical systems.

Figure 6:
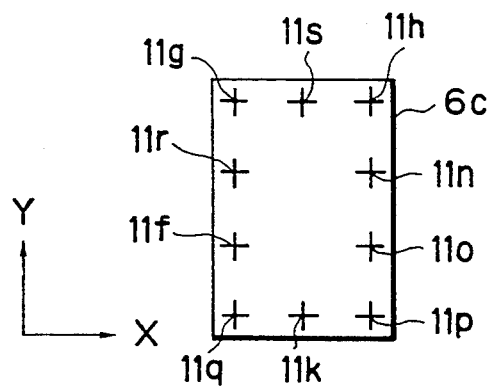
FIGS. 6 and 7 are views of an image, on the photosensitive substrate, of evaluation marks of an area to be exposed in junction.
Figure 7:
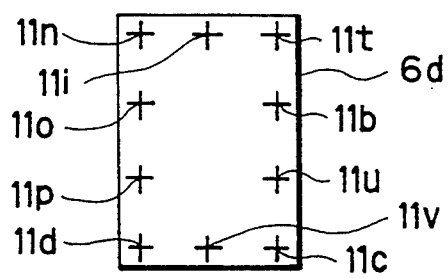
Figure 8:
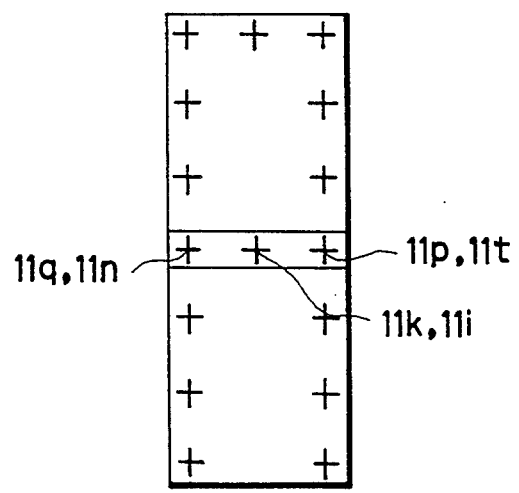
FIG. 8 is a view showing superposed evaluation points when the areas shown in FIGS. 6 and 7 are connected.

In the following there will be explained, with refernece to FIGS. 6 to 8, an exposure method constituting a second embodiment of the present invention, in which images of patterns are exposed with mutual jointing. At first there will be explained a case in which different patterns of a same reticle are exposed with mutual junction, through a projection optical system. In such case, there are considered data of the evaluation points corresponding to an area in which the pattern to be exposed is present, among the pattern area of the reference reticle shown in FIG. 2. FIGS. 6 and 7 illustrate evaluation points of projections area 6c, 6d corresponding to partial areas containing the patterns to be jointed, among the evaluations points obtained by the exposure of the reference reticle shown in FIG. 2, through the projection optical system. In these drawings, however, there are only illustrated representative points required for the explanation. In case two patterns are exposed with mutual jointing in a portion containing the evaluation points 11q, 11k, 11p in the projection area 6c and a portion containing the evaluation points 11n, 11i, 11t in the projection area 6d as shown in FIG. 8, the correcting parameters are so determined as to minimize the deviations between 11q and 11n, 11k and 11i, and 11p and 11t. If the patterns in the jointed portions extend for example in the Y-direction, the correcting parameters are so determined as to achieve sufficiently precise jointing in the perpendicular X-direction. The kinds of the correcting parameters and the determining method therefor are the same as in the first embodiment. The above-explained embodiment has shown a case of jointing two patterns, but it is also possible to joint four patterns in two rows and in two columns. In such case the correcting parameters are so determined as to minimize the deviations of the evaluations points on the sides to be mutually jointed, in the areas 6c, 6d shown in FIGS. 6 and 7.

Furthermore, the correcting parameters can be determined in a similar manner, in case of jointed exposures of a same pattern on a reticle. This corresponds, for example, to a case of jointed exposures of the evaluation points 11g, 11s, 11h and 11q, 11k, 11p of the area 6c shown in FIG. 6. The same principle is naturally applicable to a case of jointed exposure of the entire area.

Figure 14:
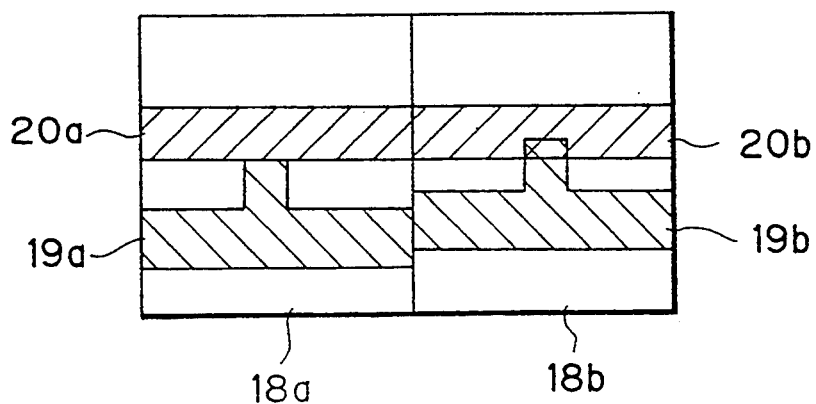
FIG. 14 is a view showing an example of superposing jointed patterns.

In addition to the foregoing, there can also be considered a case of jointing plural patterns and then superposing such jointed patterns in plural layers. In such case it is necessary to consider the precision of jointing of the patterns in the lower layer, in the jointing portions, the precision of jointing of the patterns of the upper layer to be superposed, and the precision of the superposition of the patterns of the lower and upper layers. The performance of the device will be deteriorated if one of said three precisions is unsatisfactory, even if the other two precisions are satisfactory. This fact will be explained with reference to FIG. 14. Let us consider a case of jointed exposures of patterns areas 18a, 18b as the patterns of the lower layer, and it is assumed that patterns 19a, 19b are formed with a certain mutual aberration, by a certain projection optical system. In case of exposures of pattern area respectively containing patterns 20a, 20b with respective superposition on said patterns 19a, 19b and with mutual jointing, by a projection optical system the same as or different from that used for the exposures of the lower layer, the precision of superposition of the patterns 19a and 20a or of the patterns 19b and 20b becomes unsatisfactory, even if the precision of jointing of the patterns 20a and 20b is satisfactory. In such case, therefore, the precision of the jointing of the patterns 20a, 20b has to match that of the patterns 19a, 19b. It is thus necessary to pay attention to the precision in the vicinity of the jointing portion of the patterns, and to minimize the difference in the precisions of superpositions of the different layers in said portion. Stated differently, the correcting parameters are determined so as to minimize said difference in the precisions, in consideration of the imaging characteristics in the vicinity of the jointing portion. Also in such case, the correcting parameters may be determined in consideration of the directionality of the patterns, as explained before.

In the foregoing embodiments, there have been shown representative evaluation points only, among those of the reference reticle, but the precision of superposition or jointing naturally becomes higher, with the increase in the number of the evaluation points. Also for the superposition or jointing in an area without the evaluation points, the data in such area can be obtained by interpolation.

In the foregoing embodiments, there is employed the reference reticle for measuring the distortion in order to determine the correcting parameters, but the use of such reference reticle is not indispensable. For example it is possible to effect a pattern exposure with a reticle for exposing an actual pattern and to determine the position of said pattern instead of the position of the measuring marks. Such position measurement may be made by a system of detecting the pattern for example of the alignment optical system 8 shown in FIG. 1 as an image and determining the position by image processing, a system for obtaining diffracted light by scanning a pattern with a laser beam, or a system of measuring the pattern position with an exclusive coordinate measuring device. There may also be employed a system which emits a slit light from a height the same as the surface of the photosensitive substrate and measures the position of evaluation marks or patterns on the reticle through the projection optical system. In these cases, since the position of the image of a reticle pattern for actual exposure is directly determined, there can be measured the position including the patterning error in the preparation of the reticle. A similar result can be also obtained by measuring said patterning error by other means and adding said patterning error to the result of distortion measurement. It is furthermore possible to vary the methods of distortion measurement and pattern position measurement, for the first and second layers to be formed on the photosensitive substrate.

The above-explained first and second embodiments allow determination of the correcting parameters in anticipation of the state of superposition or jointing of the patterns, or of superposition in the jointing portion of the patterns, without actual exposures.

It is furthermore possible to actually expose the patterns in superposed or jointed state, then to measure the aberrations in the obtained images and to determine the correcting parameters from said aberrations.

Figure 9:
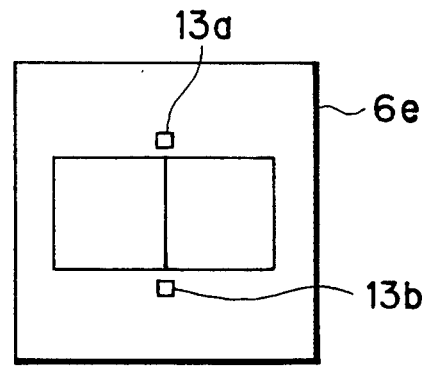
FIG. 9 is a view showing a vernier pattern formed on the photosensitive substrate when patterns of plural reticles are exposed in mutual junction.
Figure 10:
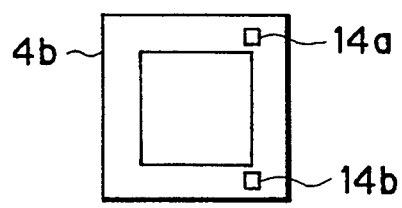
FIGS. 10 and 11 are views showing a reticle provided with a vernier pattern outside the pattern area.
Figure 11:
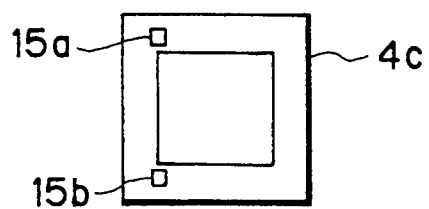

Now there will be explained a third embodiment, of the present invention, with reference to FIGS. 9 to 11. Reticles 4b, 4c shown in FIGS. 10 and 11, to be employed in the present embodiment, are provided with vernier patterns 14a, 14b, 15a, 15b outside the pattern areas to be exposed. These patterns areas are exposed in jointed form, producing vernier patterns 13a, 3b, obtained by the superposition of the vernier patterns 14a, 14b and 15a, 15b, on the photosensitive substrate 6e shown in FIG. 9. The readings of said vernier patterns 13a, 13b indicate the amounts of aberration between the superposed vernier patterns 14a, 14b and 15a, 15b, and the correcting parameters for the jointed exposures of the pattern areas are determined from the amounts of said aberrations. In this case, however, exact determination of the correcting parameters is difficult because the positions of the vernier patterns are different from the jointing position of the patterns. Also the imaging characteristics of the projection optical system may be different in the positions of the vernier patterns 14a, 14b, 15a, 15b, so that the optimum jointing is not necessarily ensured at the zero reading of the vernier patterns. In such case, readings of the vernier patterns are determined in advance, corresponding to the optimum jointing of the pattern areas, based on the above-mentioned correcting parameters for each reticle and the imaging characteristics at the position of the vernier pattern (amount of aberration in the projected position of the vernier pattern), and such readings are used for judging whether the jointing is satisfactory or not. The above-explained method may be employed, not only in the jointed exposures of the pattern areas but also in the superposed exposures thereof. Also since the present embodiment obtains the vernier pattern by means of the reticles to be used in the actual exposures, there can be achieved correction or judgment of state, including the patterning error of the reticles.

Figure 12:
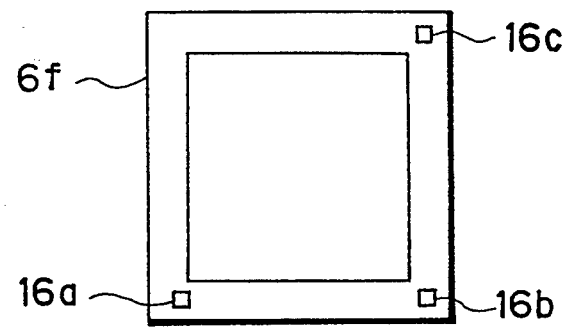
FIG. 12 is a view showing an alignment mark formed on the photosensitive substrate when patterns of plural reticles are exposed in mutual junction.
Figure 13:
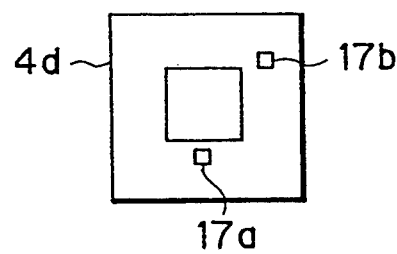
FIG. 13 is a view showing a reticle provided with an alignment mark outside the pattern area.

In the foregoing embodiments, there have been explained methods for superposed and jointed exposures of the pattern areas. In addition, a similar method may be employed for correcting the position of the alignment marks formed by exposure on a photosensitive substrate, as will be explained in the following with reference to FIGS. 12 and 13. A reticle 4d, shown in FIG. 13, is provided with alignment marks 17a, 17b outside the pattern area. Said reticle 4d is used for exposures, with the jointing of patterns on a photosensitive substrate 6f shown in FIG. 12. In these exposures, there are formed alignment marks 16a, 16b as images of the alignment mark 17a, and alignment marks 16c as an image of the alignment mark 17b, on the photosensitive substrate 6f. However, the positions of said alignment marks 16a, 16b, 16c are aberrated from the ideal positions, because of the influence of the imaging characteristics of the projection optical system. Consequently a more accurate alignment is rendered possible by determining the amounts of the positional aberrations of the alignment marks in a similar manner as explained above, and employing said amounts as offset values in the correction of the alignment mark positions at the actual alignment operation. Also in this case, there can be naturally achieved the correction including the patterning error of the reticles.

Among the foregoing embodiments, in case of effecting exposures with plural projection optical systems (plural exposure apparatus), such exposure apparatus are preferably on-line controlled for example with a computer. In such case, there can be stored the imaging characteristics of the projection optical systems and the patterning errors of the reticles to be used, and the optimum combination of the exposure apparatus for the superposed or jointed exposures can be determined by suitable simulations. For example, for a substrate on which the first layer has been exposed with an exposure apparatus, there can be determined the optimum parameters for the exposure of the second layer, or the optimum apparatus for the exposure of the second layer. It is furthermore possible to select a combination of the apparatus for exposures requiring a certain level of precision, from plural apparatus.

What is claimed is:

1. An exposure method for exposing a photosensitive substrate to first and second extended patterns of at least one original with mutual jointing of end portions thereof by means of a projection optical system, comprising:

determining distortion characteristics of said projection optical system, representing the positions of projected images within a projection area of said projection optical system;

determining, within said distortion characteristics, first distortion characteristics corresponding to an image at an end portion of said first pattern at the projection thereof, and second distortion characteristics corresponding to an image at an end portion of said second pattern at the projection thereof;

determining the difference between said first and second distortion characteristics;

projection the image of said first pattern onto said photosensitive substrate by said projection optical system;

projecting the image of said second pattern onto said photosensitive substrate by said projection optical system in jointed relationship to the image of said first pattern; and adjusting said jointing by at least one of a relative movement between said at least one original and said photosensitive substrate and a change in the projection magnification of said projection optical system, according to said difference of the distortion characteristics, prior to the projection of the images of said first and second patterns, in such a manner as to minimize the aberration of the images of said first and second patterns in a direction substantially perpendicular to an extending direction of the first and second patterns at said end portions thereof.

2. An exposure method according to claim 1, wherein said first and second patterns are a same pattern.

3. An exposure method according to claim 1, wherein said adjusting is by said change in the projection magnification of said projection optical system.

4. An exposure method according to claim 1, wherein said adjusting is by said relative movement combined with said change in the projection magnification of said projection optical system.

5. An exposure method according to claim 1, further comprising:

determining at least one of amounts of shift, rotation, elongation and contraction relating to said at least one original and said photosensitive substrate in order to minimize said differences; and causing a relative movement between said at least one original and said photosensitive substrate according to at least one of thus determined amounts of shift, rotation, elongation and contraction.

6. An exposure method for exposing a photosensitive substrate to extended patterns of first and second originals with mutual superposition in such a manner that extending directions of said patterns of said first and second originals mutually coincide, by means of first and second projection optical systems, comprising:

determining first distortion characteristics of said first projection optical system for projecting the pattern of said first original, said first distortion characteristics representing a position of a projected image within a projection area of said first projection optical system;

determining second distortion characteristics of said second projection optical system for projecting the pattern of said second original, said second distortion characteristics representing a position of a projected image within a projection area of said second projection optical system;

projecting a first image of the pattern of said first original onto said photosensitive substrate by means of said first projection optical system;

projecting, adjacent to said first image projected onto said photosensitive substrate, a second image of the pattern of said first original in jointing relationship to an end of said first projected image;

projecting a third image of the pattern of said second original onto said photosensitive substrate in superposition with said first image of the pattern of said first original, by means of said second projection optical system;

projecting, adjacent to said third image projected onto said photosensitive substrate, a fourth image of the pattern of said second original in jointing relationship to an end of said third projected image;

determining, among said distortion characteristics, a first difference between plural distortion characteristics corresponding to a jointing portion within said first and said third images, and a second difference between plural distortion characteristics corresponding to a jointing portion within said second and said fourth images; and adjusting said jointing by at least relative movement between at least one of said first and second originals and said photosensitive substrate, prior to the projection of said first to fourth images of the patterns on said first and second originals, based on said first and second differences, in such a manner as to minimize a third difference between said first and second differences in a direction substantially perpendicular to the extending directions of said patterns.

7. An exposure method according to claim 6, wherein said first projection optical system is the same as said second projection optical system.

8. An exposure method according to claim 6, wherein said adjusting is by said relative movement combined with a change in the projection magnification of at least one of said projection optical systems.

9. An exposure method according to claim 6, further comprising:

determining at least one of amounts of shift, rotation, elongation and contraction relating to at least one of said originals and said photosensitive substrate in order to minimize said third difference; and causing a relative movement between at least one of said originals and said photosensitive substrate according to at least one of thus determined amounts of shift, rotation, elongation and contraction.

10. An exposure method according to claim 6, wherein said jointing of the pattern of the first original includes jointing of different patterns on said first original.

11. An exposure method according to claim 6, wherein said jointing of the pattern of the second original includes jointing of different patterns on said second original.

12. An exposure method according to claim 6, wherein an exposure is performed by means of said projection optical systems, and said first and second distortion characteristics are distortion characteristics of each of said plurality of projection optical systems.

13. An exposure method for exposing a photosensitive substrate to extended patterns of first and second originals with mutual superposition in such a manner that extending directions of said first and second patterns mutually coincide, by means of first and second projection optical systems, comprising:

determining first distortion characteristics of said first projection optical system for projecting the pattern of said first original, said distortion characteristics representing a position of a projected image within a projection area of said first projection optical system;

determining second distortion characteristics of said second projection optical system for projecting a pattern of said second original, said second distortion characteristics representing a position of a projected image within a projection area of said second projection optical system;

projecting the first image of the pattern of said first original onto said photosensitive substrate by means of said first projection optical system;

projecting, adjacent to said first image projected onto said photosensitive substrate, a second image of the pattern of said first original in jointing relationship to an end of said first projected image;

projecting a third image of the pattern of said second original onto said photosensitive substrate in superposition with said first image of the pattern of said first original, by means of said second projection optical system;

projecting, adjacent to said third image projected onto said photosensitive substrate, a fourth image of the pattern of said second original in jointing relationship to an end of said third projected image;

determining, among said distortion characteristics, a first difference between plural distortion characteristics corresponding to a jointing portion within said first and said third images, and a second difference between plural distortion characteristics corresponding to a jointing portion within said second and said fourth images; and changing the projection magnification of at least one of said first and second projection optical systems, prior to the projection of said first to fourth images of the patterns on said first and second originals, based on said first and second differences, in such a manner as to minimize a third difference between said first and second differences in a direction substantially perpendicular to the extending direction of said patterns.

* * * * *